US00RE48650E

(19) United States
(12) Reissued Patent
Adler

(10) Patent Number: US RE48,650 E
(45) Date of Reissued Patent: Jul. 20, 2021

(54) THERMOELECTRIC PUMPING APPARATUS

(71) Applicant: Kenneth John Adler, Falls Church, VA (US)

(72) Inventor: Kenneth John Adler, Falls Church, VA (US)

(21) Appl. No.: 16/165,929

(22) Filed: Oct. 19, 2018

Related U.S. Patent Documents

Reissue of:
(64) Patent No.: 9,795,979
Issued: Oct. 24, 2017
Appl. No.: 13/925,045
Filed: Jun. 24, 2013

U.S. Applications:
(60) Provisional application No. 61/728,285, filed on Nov. 20, 2012.

(51) Int. Cl.

| | |
|---|---|
| ***B05B 17/08*** | (2006.01) |
| ***F04B 19/20*** | (2006.01) |
| ***F04B 23/02*** | (2006.01) |
| ***F04B 17/03*** | (2006.01) |
| ***H01L 35/00*** | (2006.01) |

(52) U.S. Cl.
CPC ..... *B05B 17/08* (2013.01); *F04B 17/03* (2013.01); *F04B 19/20* (2013.01); *F04B 23/02* (2013.01); *F04B 23/021* (2013.01)

(58) Field of Classification Search
CPC ..... B05B 7/08; F04B 23/021; F04B 23/02; F04B 19/20; F04B 17/03
See application file for complete search history.

(56) References Cited

U.S. PATENT DOCUMENTS

| | | | | |
|---|---|---|---|---|
| 3,082,276 A * | 3/1963 | Corry | H01L 35/00 | 136/205 |
| 3,957,107 A * | 5/1976 | Altoz et al. | F28D 15/06 | 165/276 |
| 4,284,838 A * | 8/1981 | Indech | H01G 9/21 | 136/202 |
| 4,618,462 A | 10/1986 | Fisher | F24F 6/00 | 236/44 C |
| 5,007,242 A | 4/1991 | Nakayama | A47F 3/0495 | 62/247 |
| 5,156,087 A * | 10/1992 | Cusson et al. | B29C 43/52 | 100/322 |
| 5,544,488 A | 8/1996 | Reid | F04D 25/02 | 136/204 |

(Continued)

*Primary Examiner* — William C Doerrler

(57) ABSTRACT

A thermoelectric pumping apparatus for use with a heating device includes a water receptacle. A thermoelectric device includes a "cool" side coupled to the receptacle and an opposed "hot" side, the thermoelectric device generating current upon a temperature differential between the cool and hot sides. A conduction member is proximate the hot side and in selective communication with the heating device. A spring is positioned between a top side of the conduction member and receptacle, the spring being movable between a compressed configuration at which the conduction member is in thermal communication with the hot side of the thermoelectric device and an extended configuration at which the top side of the conduction member is not in thermal communication with the hot side of the thermoelectric device. A water pump is in fluid communication with the water in the receptacle and selectively energized by the thermoelectric device to output the water.

9 Claims, 6 Drawing Sheets

(56) References Cited

U.S. PATENT DOCUMENTS 5,598,971 A 2/1997 Winther et al. ..... B01F 3/04021 236/44 A
6,257,560 B1 * 7/2001 Kim ..... B01D 47/06 239/17
6,275,652 B1 8/2001 Chauviaux ..... F24F 6/025 261/142
6,527,257 B1 * 3/2003 Schuld ..... B05B 17/085 239/17
6,883,724 B2 4/2005 Adiga et al. ..... A61L 2/22 239/102.1
7,178,344 B2 2/2007 Bell ..... B60H 1/00471 62/3.7
7,378,619 B2 * 5/2008 Rogers ..... A23G 1/20 219/385
8,069,674 B2 12/2011 Bell ..... F24F 5/0042 62/3.3
8,146,892 B2 4/2012 Hou ..... F24F 6/12 239/17
2001/0036609 A1 * 11/2001 Ehrlich ..... F21V 35/00 431/253
2003/0201336 A1 * 10/2003 Rumens et al. ..... F23D 14/76 239/17
2005/0092852 A1 * 5/2005 Muir et al. ..... B05B 17/085 239/16
2006/0144957 A1 * 7/2006 Jacobsen et al. ..... A01G 25/16 239/69
2009/0000620 A1 1/2009 Virr ..... A61M 16/142 128/203.27
2010/0127089 A1 * 5/2010 Sakami ..... F28F 27/00 236/44 C
2011/0168798 A1 * 7/2011 Mishima ..... B05B 5/0255 239/3
2012/0153636 A1 * 6/2012 Toledo ..... F01N 5/025 290/1 R
2012/0181971 A1 * 7/2012 Birkeland ..... H02J 7/00 320/101

* cited by examiner

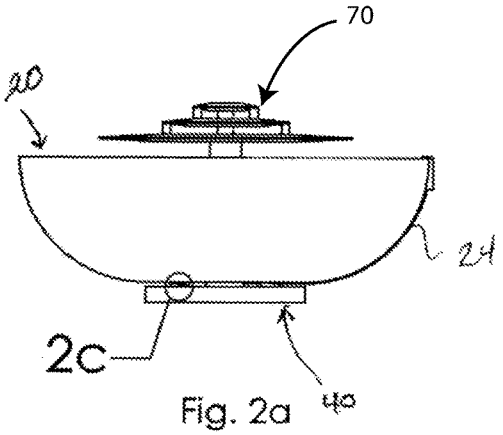
Fig. 2a
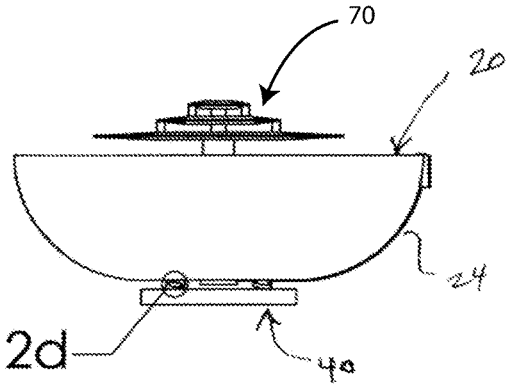
Fig. 2b
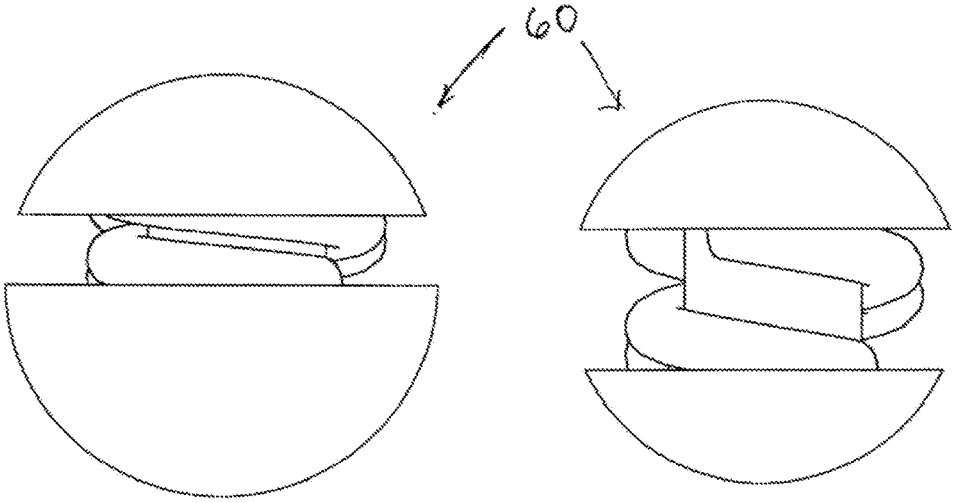
Fig. 2c
Fig. 2d

THERMOELECTRIC PUMPING APPARATUS

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

REFERENCE TO RELATED APPLICATIONS

This application claims the priority of U.S. provisional patent application 61/728,285 filed Nov. 20, 2012 titled Water Fountain and Humidifier Powered by Thermoelectric Modules.

BACKGROUND OF THE INVENTION

This application relates generally to thermoelectric devices and, more particularly, to a water pumping device powered by a thermoelectric generator.

Decorative water fountains are popular forms of landscaping and interior decor. A constantly flowing stream of water flowing over an ornamental arrangement of rocks or sculptured metal is both visually beautiful and audibly soothing. Water attractions such as these are typically used in homes, offices, or public areas.

Devices and systems such as those described above, however, typically require pumps that are powered by traditional AC power from a wall socket or perhaps by DC battery power. Unfortunately, AC power sources may not always be available and, in recent times, are seen as undesirable or a waste of valuable resources. So having a ready power source may be a problem in powering water fountain systems. In addition, having a constantly flowing water attraction may not even be expected in some environments such as around a wood burning stove in the winter months of the year.

Therefore, it would be desirable to have a thermoelectric pumping apparatus that can pump water in a decorative water attraction using electricity generated by a thermoelectric apparatus in communication with a heating device such as a wood burning stove or the like. Further, it would be desirable to have a thermoelectric pumping apparatus that includes a basin of water that provides a humidifying and evaporative effect at the same time that heat from the heating device is converted into electrical current that powers a water pump.

SUMMARY OF THE INVENTION

A thermoelectric pumping apparatus for use with a heating device according to the present invention includes a liquid receptacle having bottom and side walls configured to retain a volume of water. A thermoelectric device includes a "cool" side coupled to an exterior surface of the bottom wall of the liquid receptacle and an opposed "hot" side, the thermoelectric device configured to generate current in accordance with a temperature differential between the cool and hot sides thereof. A conduction member includes a top side proximate to the hot side of the thermoelectric device and an opposed bottom side in communication with the heating device.

In one embodiment, a spring member is sandwiched between the top side of the conduction member and the exterior surface of the bottom wall of the liquid receptacle, the spring member being movable between a compressed configuration at which the top side of the conduction member is in direct physical contact with the hot side of the thermoelectric device and an extended configuration at which the top side of the conduction member is not in direct physical contact with the hot side of the thermoelectric device. A water pump is situated in fluid communication with the water retained in the liquid receptacle and in electrical communication with the thermoelectric device, the water pump being energized by current generated by the thermoelectric device such that the water pump outputs the retained water in the liquid receptacle when energized.

The present invention utilizes a thermoelectric device, sometimes referred to as a thermoelectric generator, a thermoelectric module, or a thermocouple. Thermoelectric modules are solid-state integrated circuits that use established thermoelectric effects known as the Seebeck effect. A thermoelectric module consist of p-type and n-type semiconductor materials that form a thermocouples situated between two thin ceramic wafers. Then, when a temperature differential is experienced by the two sides, an electric current is generated. In short, a thermoelectric generator takes a temperature difference and turns it into electric power As will be described in more detail below, heat from a heating device, such as a wood burning stove, will be used to heat up a metal conduction member. This heat will be selectively transferred to the hot side of a thermoelectric device. By contrast, the cool side of the thermoelectric device will have a cooler temperature due to its immediate proximity to water within a liquid receptacle. This temperature differential between the two sides of the thermoelectric device will generate electrical current as explained above. It is further understood that the heat from the "hot side" will be thermally transferred to the "cold side" and, consequently, to the water retained in the liquid receptacle. Water holds several times more heat than the metal conduction member. Further, water never gets hotter than 212° F. (100° C.) as it would simply boil away or just evaporate at lower temperatures. For this reason, the water retained in the receptacle must be refilled in time in order for this apparatus to continue to operate without overheating. This evaporative effect increases humidity and may be desirable for moisturizing plants or even a person's skin.

In the present invention, the thermoelectric device is electrically connected to a pump that is energized by current generated as explained above. Preferably, the pump is situated to transfer water from the receptacle to a water fountain such that water is continuously flowed over the ornamental features of the fountain. Of course, the electricity generated by the thermoelectric device may be transmitted to an ornamental lighting device, electronic mister, or a fan so as to enhance the decorative features and humidifying effect of the fountain. Other electronic devices such as cell phones, rechargeable batteries and lights can also be powered by the device as will be described in more detail below.

Therefore, a general object of this invention is to provide a thermoelectric pumping apparatus that utilizes electricity generated from a thermoelectric generator to energize a water pump to output water to a water fountain.

Another object of this invention is to provide a thermoelectric pumping apparatus, as aforesaid, that draws heat from a heating apparatus across the hot side of a thermoelectric apparatus and cool water across the cool side of the thermoelectric apparatus such that electrical current is generated so as to power the water pump to pump water to a water feature.

Still another object of this invention is to provide a thermoelectric pumping apparatus, as aforesaid, that only generates electricity to energize the water pump when there is a predetermined volume of water in a liquid receptacle.

Yet another object of this invention is to provide a thermoelectric pumping apparatus, as aforesaid, that may be situated on top of a wood burning stove or the like.

A further object of this invention is to provide a thermoelectric pumping apparatus, as aforesaid, that is user-friendly to operate.

A still further object of this invention is to provide a thermoelectric pumping apparatus, as aforesaid, that does not need batteries or AC power source.

Other objects and advantages of the present invention will become apparent from the following description taken in connection with the accompanying drawings, wherein is set forth by way of illustration and example, embodiments of this invention.

BRIEF DESCRIPTION OF THE DRAWINGS

FIG. 2a is a front view of the pumping apparatus as in FIG. 1 removed from the heating apparatus and shown with springs at a compressed configuration;

FIG. 2b is a front view of the pumping apparatus s in FIG. 2a shown with springs at an extended configuration;

FIG. 2c is an isolated view of the compressed springs on an enlarged scale taken from FIG. 2a;

FIG. 2d is an isolated view of the extended springs on an enlarged scale taken from FIG. 2b;

DESCRIPTION OF THE PREFERRED EMBODIMENT

Figure 1:
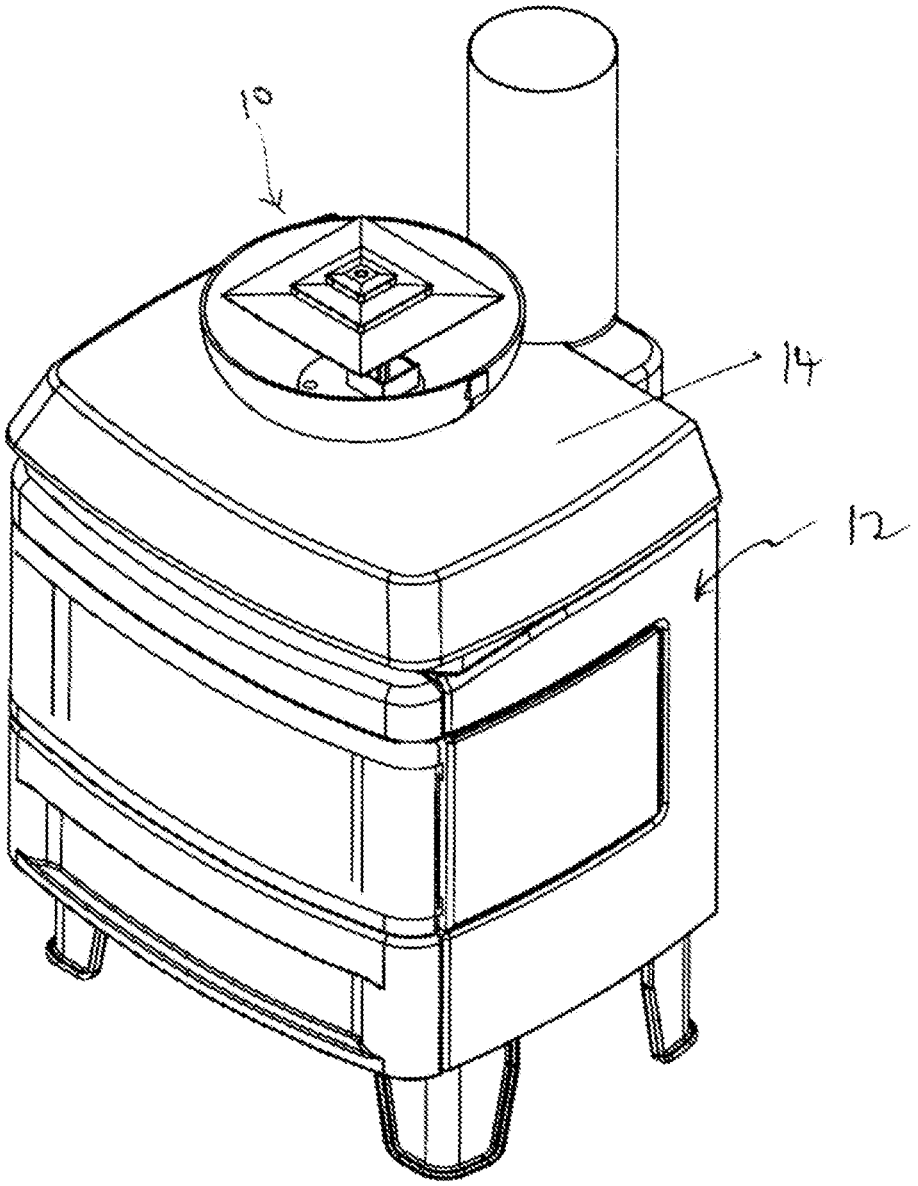
FIG. 1 is a perspective view of a thermoelectric pumping apparatus according to a preferred embodiment of the present invention in use on a heating apparatus.

A thermoelectric pumping apparatus according to a preferred embodiment of the present invention will now be described with reference to FIGS. 1 to 5 of the accompanying drawings. The pumping apparatus 10 includes a liquid receptacle 20 configured to contain a volume of water, a thermoelectric device 30, a conduction member 40, a water pump 50, and a spring member 60. The pumping apparatus 10 is intended for use with a heating device 12 such as a wood burning stove. As described herein, the heating device 12 includes a top portion 14 from which heat may be drawn for use by the apparatus 10.

The liquid receptacle 20 may be a bowl, basin, bucket, ceramic vase, or the like, having a bottom wall 22 and an upstanding side wall 24 such that the receptacle 20 is capable of containing a volume of liquid such as water. The bottom wall 22 will act as a "cool side" to the thermoelectric device 30 described more fully below. It will be seen later that an amount of water must be retained in the receptacle 20 at all times that operation of the apparatus 10 is desired. Without water in the receptacle, electricity will not be generated and water cannot be pumped to the water fountain 70 or any other electrically operable element.

The thermoelectric device 30 includes a "cool side" 32 that is coupled to an exterior surface of the bottom wall 22 of the liquid receptacle 20 and an opposed "hot side" 34. As explained previously, a thermoelectric device includes two sides that sandwich thermocouple elements that generate electrical current when the two sides experience a temperature differential. In fact, more current is produced as the temperature differential is increased. In the present configuration, the cool side 32 of the thermoelectric device 30 is influenced by the coolness of the water retained in the receptacle 20.

The conduction member 40 according to the present invention includes a metallic construction capable of efficiently conducting heat. For instance, the conduction member 40 may be constructed of aluminum, copper, iron, or even non-metallic fibers, or the like. The conduction member 40 includes a bottom side 42 configured and intended to be in contact with the heating device 12. For instance, the bottom side 42 of the conduction member 40 may have a generally planar configuration so as to rest atop a stove top. The conduction member 40 also includes an opposed top side 44 configured to bear against the hot side 34 of the thermoelectric device 30 as will be described in more detail later. In operation, heat from the heating device 12 (stove) is conducted from the bottom side 42 to the top side 44 thereof and will be conducted to the hot side 34 of the thermoelectric device 30 and, eventually, to the cold side 32 and to the water retained in the receptacle 20 as will be described further later. A plurality of bolts 46 may be mounted to the top side 44 of the conduction member 40 and spaced apart, the bolts 46 being configured to bear against the exterior surface of the bottom wall 22 of the liquid receptacle 20.

Figure 3:
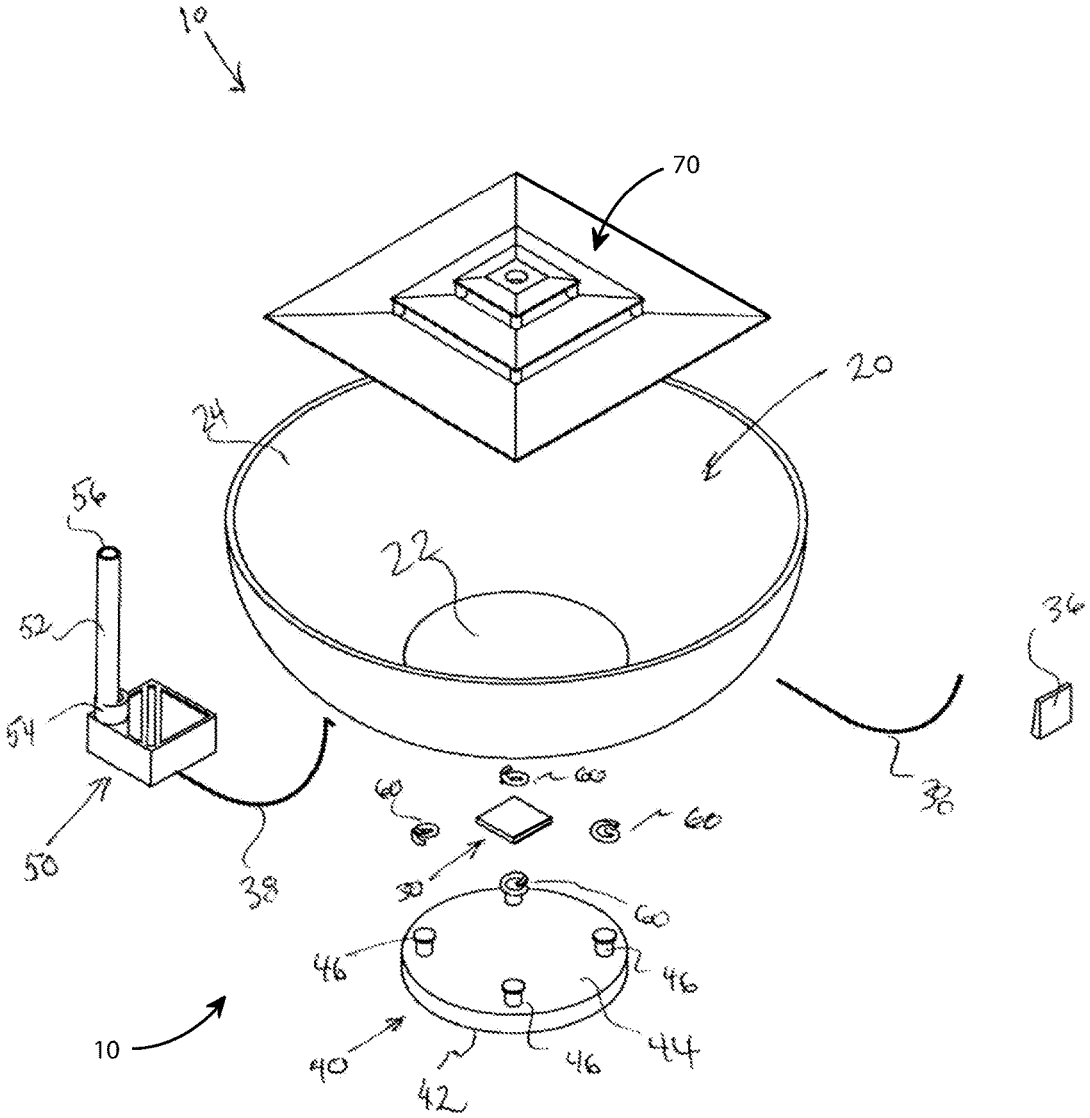
FIG. 3 is an exploded view of the pumping apparatus removed from the heating device.

The thermoelectric pumping apparatus 10 includes at least one but preferably a plurality of spring members 60 configured to regulate when heat from the conduction member 40 is conveyed to the thermoelectric device 30 and, as a result, when electrical current is generated so as to energize the water pump 50. More particularly, a spring member 60 is coupled to the top side 44 of the conduction member 40 such that the spring member 60 is sandwiched between the top side 44 of the conduction member 40 and the exterior surface of the bottom wall 22 of the liquid receptacle 20. In an embodiment having a plurality of spring members 60, the spring members 60 are spaced apart about the top side 44 of the conduction member 40 as shown in FIG. 3.

The spring members 60 are configured to prevent damage to the thermoelectric device 30, such as may be caused by overheating. Each spring member 60 is a compression spring that may be compressed by external pressure and which is normally biased to expand outwardly/upwardly. A spring member 60 is compressed by the liquid receptacle 20 when the weight of water contained therein causes the receptacle 20 to be moved downwardly by the act of gravity. When the spring member 60 is compressed, the hot side 34 of the thermoelectric device 30 bears against the top side 44 of the conduction member 40. In other words, each spring member 60 is movable between a compressed configuration at which the top side 44 of the conduction member 40 is in direct contact thermal communication with said hot side 34 of the thermoelectric device and an extended configuration at which said top side 44 of said conduction member 40 is not in thermal communication with the hot side 34 of said thermoelectric device 30. Further, when there is direct thermal communication, the thermoelectric device 30 produces electrical current. Conversely, when there is no thermal communication, the thermoelectric device 30 does not produce electrical current.

It is understood that the spring assembly described above provides protection to the thermoelectric device 30, especially from overheating if there is no water in the liquid receptacle 20. This is an important feature because the thermoelectric device 30 can be damaged or destroyed if the thermoelectric device 30 exceeds a maximum temperature. The configuration of the spring members 60 also enables a user to replace the thermoelectric device 30 in case the thermoelectric device 30 is damaged by high temperatures. In one embodiment, the fasteners that sandwich the thermoelectric device 30 between the conduction member 40 and the liquid receptacle 20 itself may be inserted through the bottom of the heat conduction member 40 and screwed into the receptacle 20. In another embodiment, the thermoelectric device 30 may be separated from the heat source by placing spring loaded steel ball bearings into the bottom of the conduction member 40. When the water receptacle 20 nears empty, the lack of weight will automatically lift the device and reduce direct heat exposure.

The water pump 50 may include a motor with internal propellers or the like (not shown) that is capable of pumping water. A tube 52 includes an inlet 54 coupled to the water pump 50 and an outlet 56 displaced from the pump 50 such that water, when the pump 50 is situated in the water retained in the liquid receptacle 20 and when the pump 50 is energized, may be transmitted to the outlet 56 of the tube 52. Preferably, the water pump 50 is positioned adjacent an interior surface of the bottom wall 22 of the liquid receptacle 20 where water can be gathered and pumped.

With further reference to the water pump 50, the water pump 50 is preferably situated near the bottom of the interior of the liquid receptacle 20. The water pump 50 includes an intake pipe that is directed downwardly toward the bottom of the receptacle 20. This is important to help prevent the hottest water from stratifying at the bottom of the receptacle 20 and to encourage greater mixing of warmer and cooler water. Locating the pump 50 near the bottom also increases the cool side heat transfer rate. Pumping the water over the fountain 70 increases the evaporation rate of the water causing it to cool down more quickly, thereby increasing the temperature differential and improving the electrical efficiency of the thermoelectric device 30.

Positioning the pump 50 near the bottom also maximizes the efficiency of the thermoelectric device 30 and prevents damage to the thermoelectric device 30 from overheating. The pump, however, is not in direct contact with the bottom of the receptacle 20, where it could potentially be damaged by high heat. By positioning the pump 50 off the bottom of the receptacle 20, the thermal conductivity of the receptacle 20 is increased by allowing more water exposure. In some embodiments, the water pump 50 may include structures that support the pump 50 upon the bottom of the water receptacle 20 that do not conduct heat, which could damage the pump 50 if the receptacle 20 was to overheat due to no water.

Figure 4:
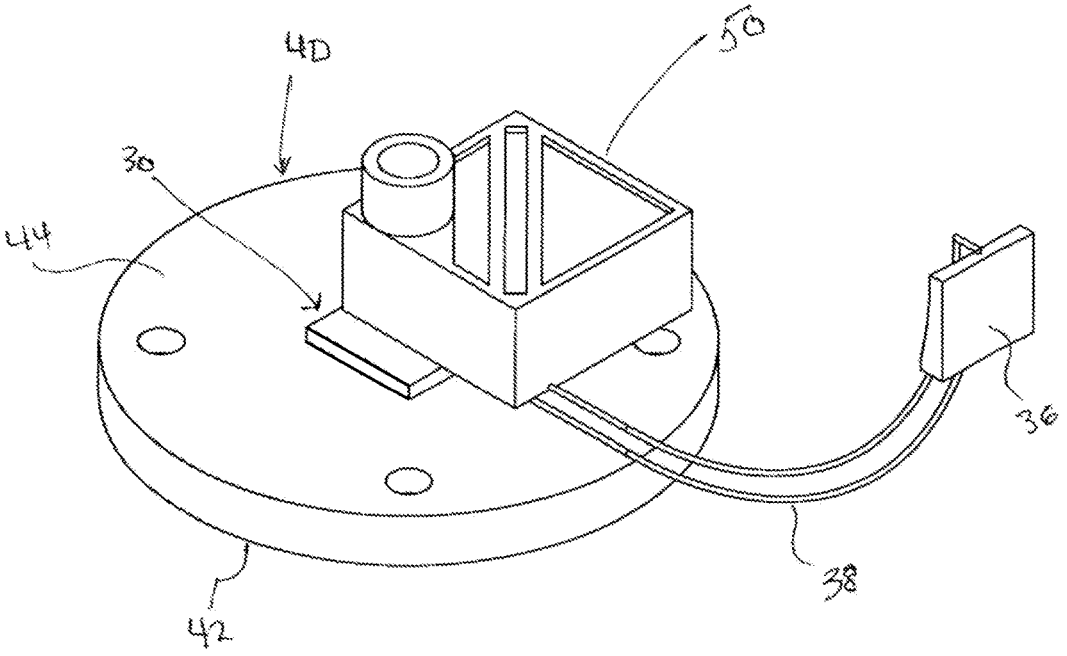
FIG. 4 is an isolated view on an enlarged scale of the conduction member and pumping member.
Figure 5:
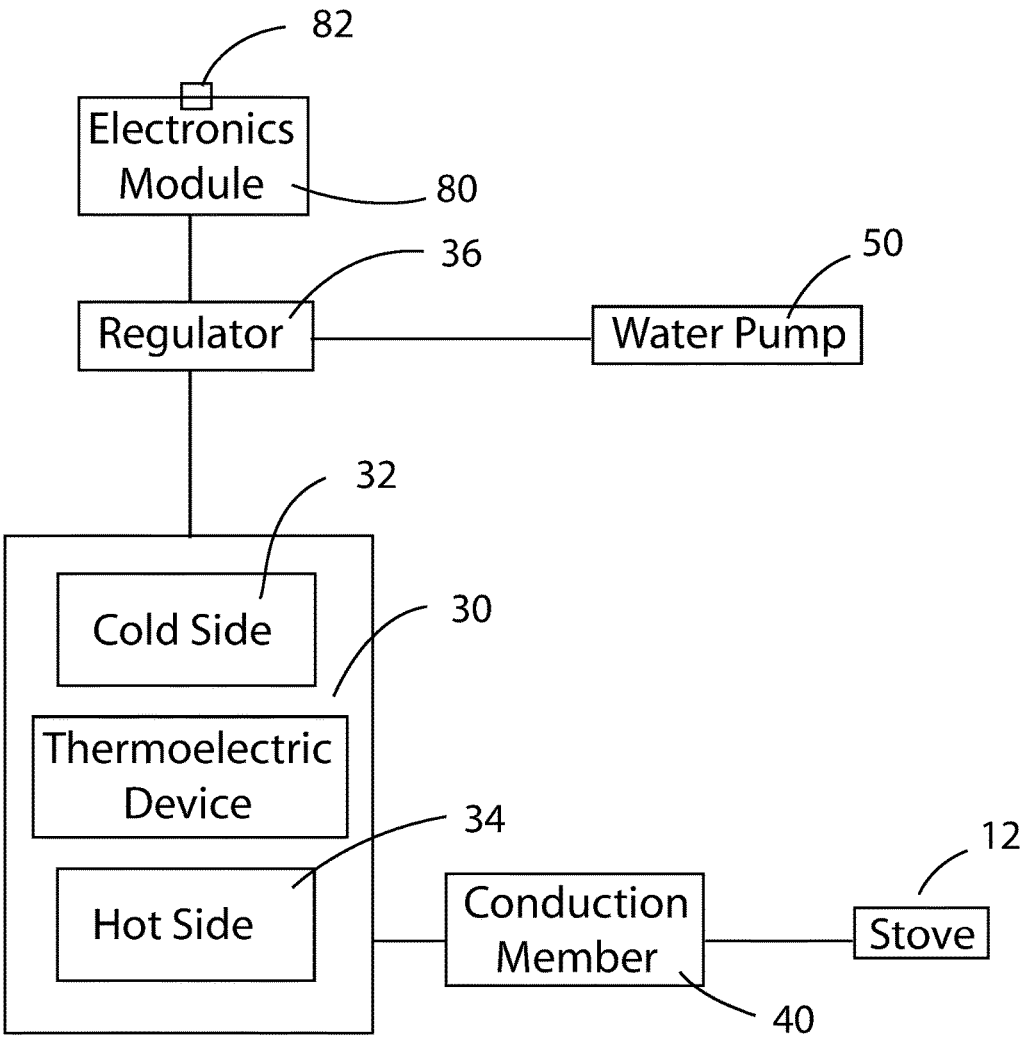
FIG. 5 is a block diagram of the electrical and operative components of the present invention.
Figure 6:
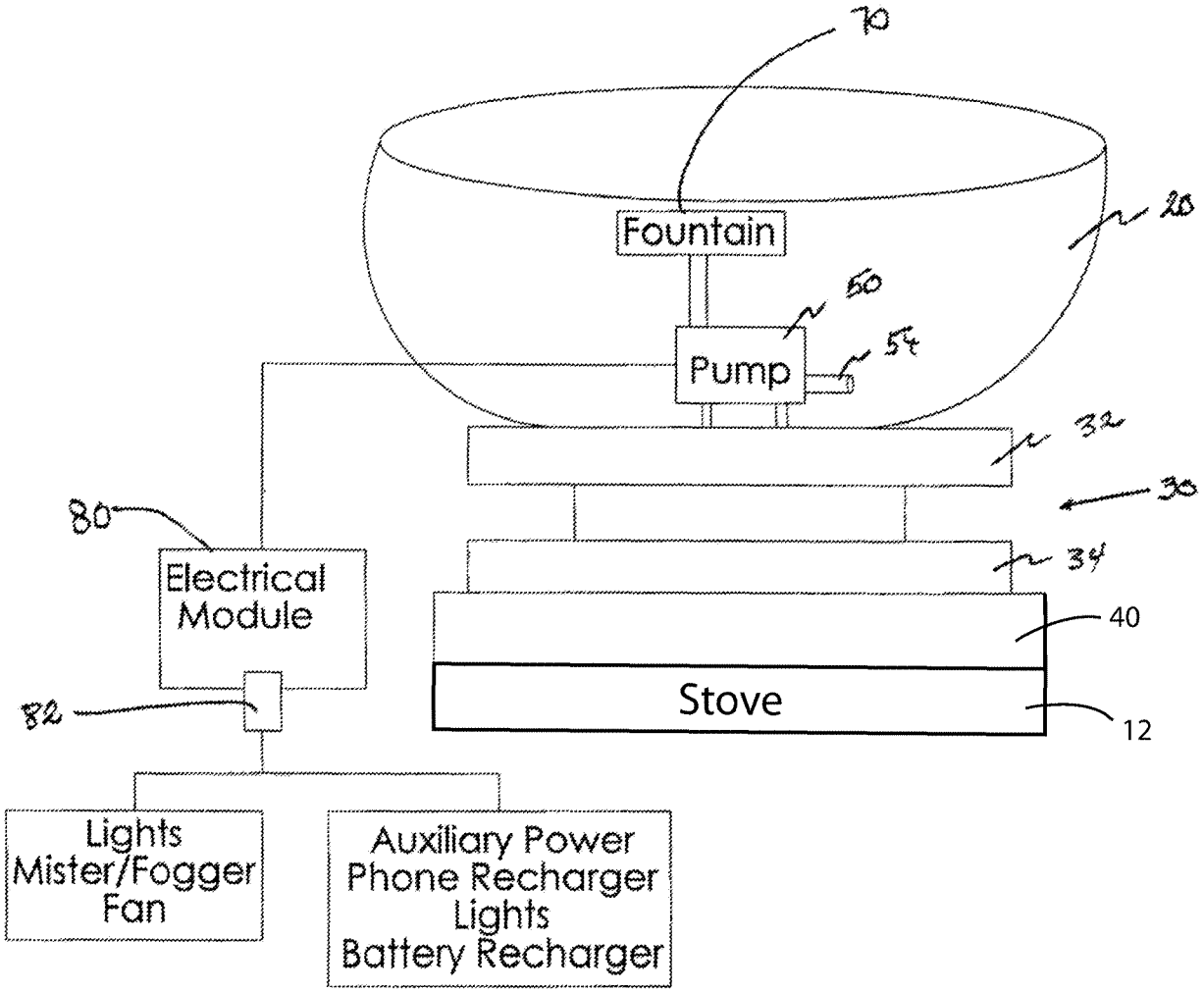
FIG. 6 is a block diagram of the thermoelectric pumping apparatus as in FIG. 1.

The thermoelectric device 30 may be electrically connected to the water pump 50 with wires 38. A voltage regulator 36 may be situated intermediate the thermoelectric device 30 and the water pump 50 such that a predetermined amount of voltage is delivered to the water pump 50 regardless of what quantity of voltage is generated by the thermoelectric device 30. The voltage regulator may include voltage limiters and other functional components that limit damage to the water pump 50 due to under-voltage and over-voltage conditions. The voltage regulator 36 may be configured such that voltages below that required by the pump 50 are boosted and voltages above those for the pump 50 may be reduced to the amount required. FIG. 4 illustrates how the thermoelectric device 30 may be electrically connected to the regulator 36 and then the regulator 36 may be electrically connected to the water pump 50. It is understood that FIG. 4 does not indicate that the water pump 50 is to be physically located by or coupled in any way to the conduction member 40 or thermoelectric device 30. To be sure, FIG. 1 more accurately depicts a preferred arrangement of the components of the apparatus 10: the thermoelectric device 30 is situated beneath the liquid receptacle 20 and electrically connected to the regulator 36 which is then electrically connected to the water pump 50 that is situated within the interior of the liquid receptacle 20.

The voltage regulator 36 may be included in an electronics control module 80 and electrically connected to additional electronic elements. For instance, electricity generated by the thermoelectric device 30 may be utilized for additional purposes than just energizing the water pump 50 as primarily described in this application. Specifically, the electronics control module 80 may include a USB port 82 by which other electrically powered devices may be docked or plugged in and energized. In other words, auxiliary electronic devices other than the water pump 50 may be powered by electricity generated by the thermoelectric device 30. For instance, the electronics module 80 may provide an auxiliary source of power for devices such as, but not limited to, lights, a mister or fogger, a fan, a cell phone recharger, a battery recharger, or the like. Some of these devices may be useful auxiliary components that contribute to the entertainment, ambiance, or functionality of the primary water fountain 70 described below.

The electronics control module 80 may include a processor and memory and be configured to operate in more than one mode. Programming instructions may be stored in memory and be executed by the processor to carry out a method of operation. Alternately, of course, electronic circuitry may be included to provide this functionality. Specifically, the control module 80 may provide (1) a startup mode in which only the water pump 50 receives electricity generated by the thermoelectric device 30, (2) an operating mode in which other accessory devices may be plugged in and receive electricity generated by the thermoelectric device 30, and (3) a high temperature mode that actuates an alarm in case a water level in the receptacle 20 falls below a predetermined level, so as to prevent damage to the thermoelectric device 30 or pump 50.

The thermoelectric pump apparatus 10 may include a water fountain 70. It is understood that the term "water fountain" is used generally in the specification and may include multiple components as described below. For instance, the water fountain 70 may simply include a rock arrangement or one or more platforms in an ornamental arrangement.

Preferably, the outlet 56 of the tube 52 may be situated at an upper extent of the water fountain 70 such that water from the receptacle 20 is dispensed to spill over the water fountain 70 when the water pump 50 is energized. As indicated above, auxiliary components such as lights, fan, mist/fogger elements may also be included for use with the water fountain 70. Water may be dispensed to spill over rocks/platform or may be propelled into the air through a spray nozzle, etc.

In use, the heating device 12 may be activated, such as by loading it with wood and igniting the wood if the heating device 12 is a wood burning stove. Other heating devices, of course, may alternatively be used, such as a stove operated by natural gas, propone, pellets, oil, coal, or the like. Then, a user may substantially fill the liquid receptacle 20 with water, understanding that the water will be lost by evaporation as the apparatus 10 is operated. The weight of the water will cause the liquid receptacle 20 to compress the spring 60 or plurality of springs 60. Compression of the spring members 60 causes the conduction member 40 and hot side 34 of the thermoelectric device 30 to be in thermal communication. Since the cold side 32 of the thermoelectric device 30 is cool (because of the water) and the hot side 34 of the thermoelectric device 30 is heated (by the conduction member 40 and heating device 12), electrical current is generated and delivered to the water pump 50 as described above. The pump 50, in turn, delivers water from the liquid receptacle 20 to the water fountain 70 through the tube 52. The cycle described above may be repeated or continuous, causing the water fountain to run generally continuously so long as the liquid receptacle is kept in a generally filled condition and the heating device is being operated.

It is understood that while certain forms of this invention have been illustrated and described, it is not limited thereto except insofar as such limitations are included in the following claims and allowable functional equivalents thereof.

The invention claimed is:

1. A thermoelectric fountain apparatus for use with a [wood or gas] stove[,] the thermoelectric fountain apparatus comprising:

a liquid receptacle having a bottom wall and a side wall extending upwardly from the bottom wall, said bottom wall and said side wall configured to selectively retain a volume of water; a thermoelectric device having a "cool" side coupled to an exterior surface of said bottom wall of said liquid receptacle and an opposed "hot" side, said thermoelectric device configured to generate electrical current in accordance with a temperature differential between said cool side and said hot side thereof; a conduction member having a top side proximate said hot side of said thermoelectric device and an opposed bottom side in communication with the stove;

an electric water pump submerged in the water retained in said liquid receptacle and in electrical communication with said thermoelectric device, said water pump being energized by current generated by said thermoelectric device such that said water pump pumps the water retained in said liquid receptacle when energized;

a tube having an inlet in fluid communication with said water pump and an opposed outlet displaced from said water pump, wherein said water pump is submerged in the water retained in said liquid receptacle such that the water retained in said liquid receptacle is pumped through said tube to said outlet when said water pump is energized and so that the hottest water is prevented from stratifying at said bottom of said liquid receptacle and to encourage greater mixture of hotter and cooler water, which increases temperature differential and improves electrical efficiency of said thermoelectric device;

a fountain member situated proximate said liquid receptacle, said fountain member being in communication with said outlet of said tube such that water pumped through said tube is communicated to said fountain member wherein water is pumped out on said fountain member which increases an evaporation rate of the water and causes the water to cool down more rapidly, thereby-reducing the temperature at the "cool" side of said thermoelectric device and increases the temperature differential which improves an electrical efficiency of said thermoelectric device.

2. The thermoelectric fountain apparatus as in claim 1, further comprising a voltage regulator in operative electrical communication with said water pump such that said thermoelectric device is electrically connected to said voltage regulator and said voltage regulator is electrically connected to said water pump, said voltage regulator being configured to output a predetermined quantity of electricity to said water pump regardless of an amount of voltage received by said voltage regulator.

3. The thermoelectric fountain apparatus as in claim 1, further comprising a plurality of bolts spaced apart on said top side of said conduction member, said plurality of bolts configured to bear against said bottom wall of said liquid receptacle at said compressed configuration.

4. The thermoelectric fountain apparatus as in claim 2, further comprising an electronics module electrically connected to said voltage regulator, said electronics module having a USB port configured to selectively dock an auxiliary electronic device and selectively transfer electricity generated by said thermoelectric device to said auxiliary electronic device.

5. The thermoelectric fountain apparatus as in claim 4, wherein said auxiliary electronic device is taken from the group including a fan, a lighting device, a mister, a fogger, a battery recharger, and a phone recharger.

6. The thermoelectric fountain apparatus as in claim 1, further comprising means for providing an alert if a water level in said liquid receptacle falls below a predetermined level.

7. The thermoelectric fountain apparatus as in claim 1, further comprising: a spring member sandwiched between said top side of said conduction member and said exterior surface of said bottom wall of said liquid receptacle, said spring member being movable between a compressed configuration at which said top side of said conduction member is in thermal communication with said hot side of said thermoelectric device and an extended configuration at which said top side of said conduction member is not in thermal communication with said hot side of said thermoelectric device;

wherein said spring member is automatically moved to said compressed configuration when a predetermined volume of water is retained in said liquid receptacle;

wherein said spring member includes a plurality of spaced apart compression springs, each compression spring being normally biased toward said extended configuration when less than a predetermined weight is received thereon and that is compressed toward said compressed configuration by the weight of the water retained in said liquid receptacle.

8. The thermoelectric fountain apparatus as in claim 1, wherein said thermoelectric device is electrically connected to said water pump with wires.

9. The thermoelectric fountain apparatus as in claim 1, wherein said water pump is positioned adjacent to but not in direct contact with said bottom wall of said liquid receptacle so as to prevent said water pump from being damaged by high heat of said bottom wall.

* * * * *